United States Patent
Mori et al.

(10) Patent No.: US 6,722,622 B2
(45) Date of Patent: Apr. 20, 2004

(54) VIBRATOR SUPPORT STRUCTURE, VIBRATING GYROSCOPE THEREWITH, AND ELECTRONIC DEVICE USING THE SAME

(75) Inventors: Akira Mori, Nagaokakyo (JP); Nobuyuki Ishitoko, Moriyama (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 10/083,850

(22) Filed: Feb. 26, 2002

(65) Prior Publication Data

US 2002/0125795 A1 Sep. 12, 2002

(30) Foreign Application Priority Data

Feb. 26, 2001 (JP) .......................................... 2001-050679

(51) Int. Cl.[7] .............................................. G01C 19/00
(52) U.S. Cl. ................. 248/638; 73/504.14; 73/504.12; 310/354
(58) Field of Search ................. 248/638, 560, 248/575, 618; 310/354, 353; 73/504.14, 504.12

(56) References Cited

U.S. PATENT DOCUMENTS

| 5,635,647 | A | * | 6/1997 | Heinouchi | 73/662 |
|---|---|---|---|---|---|
| 5,895,999 | A | * | 4/1999 | Okaguchi et al. | 310/367 |
| 6,023,973 | A | * | 2/2000 | Yabe et al. | 73/504.12 |
| 6,108,298 | A | * | 8/2000 | Miyazaki et al. | 369/291 |
| 6,116,086 | A | * | 9/2000 | Fujimoto | 73/504.14 |
| 6,507,136 | B1 | * | 1/2003 | Yamaguchi | 310/128 |
| 6,532,816 | B2 | * | 3/2003 | Fujimoto | 73/504.14 |
| 6,655,210 | B2 | * | 12/2003 | Fujimoto | 73/504.14 |
| 2002/0100324 | A1 | * | 8/2002 | Fujimoto | 73/504.04 |

FOREIGN PATENT DOCUMENTS

| JP | 56-14711 | | 2/1981 |
| JP | 9-269227 | | 10/1997 |
| JP | 10062179 | A * | 3/1998 |
| JP | 11281365 | A * | 10/1999 |
| JP | 2001221639 | A * | 8/2001 |

* cited by examiner

Primary Examiner—Anita King
(74) Attorney, Agent, or Firm—Keating & Bennett, LLP

(57) ABSTRACT

A compact vibrator support structure has a very high "vibration confinement effect", and includes a vibrator, vibrator support members, and a vibrator base, which supports the vibrator in midair via the vibrator support members and is made of a material having a specific gravity of about 3.0 or above. Since the high vibration confinement effect of the vibrator support structure reduces leakage of vibration from the vibrator base, the stability of the vibration of the vibrator is greatly improved, thereby increasing the detecting accuracy of angular velocity. This eliminates the need to enlarge the vibrator base or to adhere a weight thereto, resulting in a miniaturized vibrating gyroscope.

14 Claims, 5 Drawing Sheets

VIBRATOR SUPPORT STRUCTURE, VIBRATING GYROSCOPE THEREWITH, AND ELECTRONIC DEVICE USING THE SAME

BACKGROUND OF THE INVENTION

1. Field of the Invention

The present invention relates to a vibrator support structure, a vibrating gyroscope therewith, and an electronic device including such a vibrating gyroscope with the vibrator support structure.

2. Description of the Related Art

A tuning fork type vibrator which is used for a vibrating gyroscope, and which vibrates in a both-end bending vibration mode, is often supported by fixing the vicinities of the node point thereof to the support members of which the end portions are fixed to the vibrator base. The term "vibrator base" refers to an element that provides a base for stably supporting the vibrator. An example of such a vibrator support structure is disclosed in Japanese Unexamined Patent Application Publication No. 9-269227, in which a frame body 17 corresponds to the vibrator base, and wire members 8 correspond to the support members.

In such a conventional vibrator support structure, the vibrator base is formed by injection-molding using an engineering plastic such as a liquid crystal polymer (LCP; specific gravity: 1.6).

In order to prevent vibration of the vibrator from leaking to the outside, it is necessary to improve the "vibration confinement effect" of the vibrator base by increasing the mass thereof. For this purpose, the vibrator base has been enlarged, or a weight such as a brass member has been adhered to the vibrator base. A technique for adhering the weight to the vibrator base is disclosed in Japanese Unexamined Patent Application Publication No. 56-14711.

With the increasing range of uses for vibrating gyroscopes, the demand for miniaturizing the gyroscopes has grown. This has led directly to the demand for the miniaturization of vibrators and vibrator support structures.

However, if the mass of the vibrator base is reduced by the miniaturization thereof, a problem occurs in that the "vibration confinement effect" of the vibrator base decreases and that the vibration of the vibrator becomes unstable.

On the other hand, if a weight is adhered to the vibrator base, the "vibration confinement effect" of the vibrator base will be improved, but this will create other problems in that not only the miniaturization of the vibrator support structure is prevented, but also the number of components and the number of assembly man-hours are increased, resulting in an impediment to the cost reduction.

SUMMARY OF THE INVENTION

In order to overcome the problems described above, preferred embodiments of the present invention provide a compact vibrator support structure having a high "vibration confinement effect", a vibrating gyroscope therewith, and an electronic device including the vibrating gyroscope with the novel vibrator support structure.

According to a preferred embodiment of the present invention, a vibrator support structure includes a vibrator base, support members fixed to the vibrator base, and a vibrator supported by the support members. In this vibrator support structure, the vibrator base is preferably made of a material having a specific gravity of about 3.0 or greater.

In the vibrator support structure according to preferred embodiments of the present invention, it is preferred that the vibrator base be formed by molding using a resin material into which a metal or a ceramic is mixed.

Furthermore, another preferred embodiment of the present invention provides a vibrating gyroscope including the above-described vibrator support structure.

Moreover, another preferred embodiment of the present invention provides an electronic device using the above-described vibrating gyroscope.

With these arrangements, in the vibrator having the vibrator support structure according to preferred embodiments of the present invention, the stability of vibration is greatly improved, and the miniaturization thereof can be achieved.

In the vibrating gyroscope according to preferred embodiments of the present invention, the detecting accuracy of angular velocity is greatly increased.

In the electronic device according to preferred embodiments of the present invention, the correction of a camera vibration, the detection of a vehicle position, and other improvements of various devices can be achieved with a high degree of accuracy, and thereby a high performance can be provided.

The features, elements, characteristics and advantages of the present invention will be clear from the following detailed description of preferred embodiments of the invention in conjunction with the accompanying drawings.

DETAILED DESCRIPTION OF PREFERRED EMBODIMENTS

Figure 1:
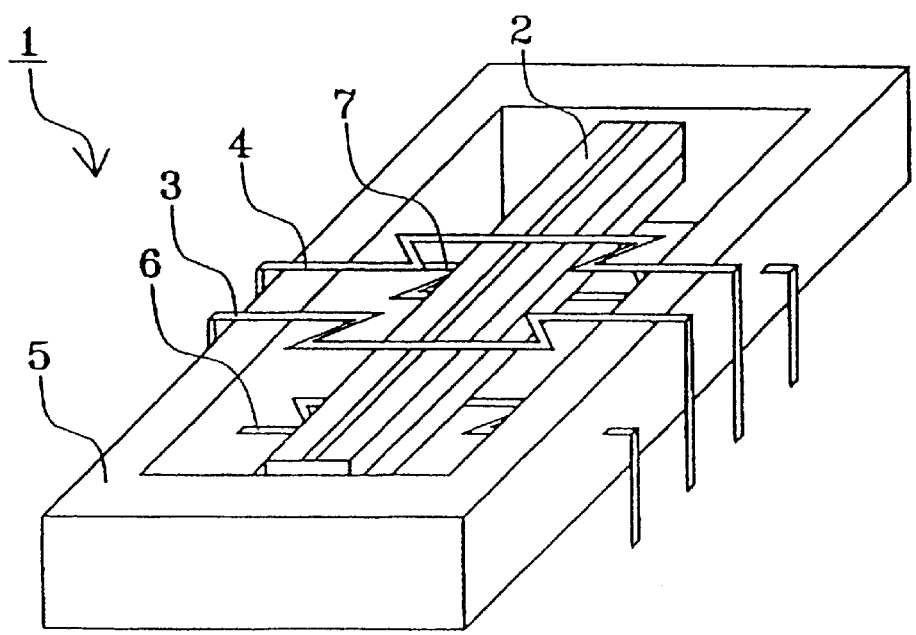
FIG. 1 is a perspective view showing a preferred embodiment of a vibrator portion having a vibrator support structure according to the present invention.
Figure 2:
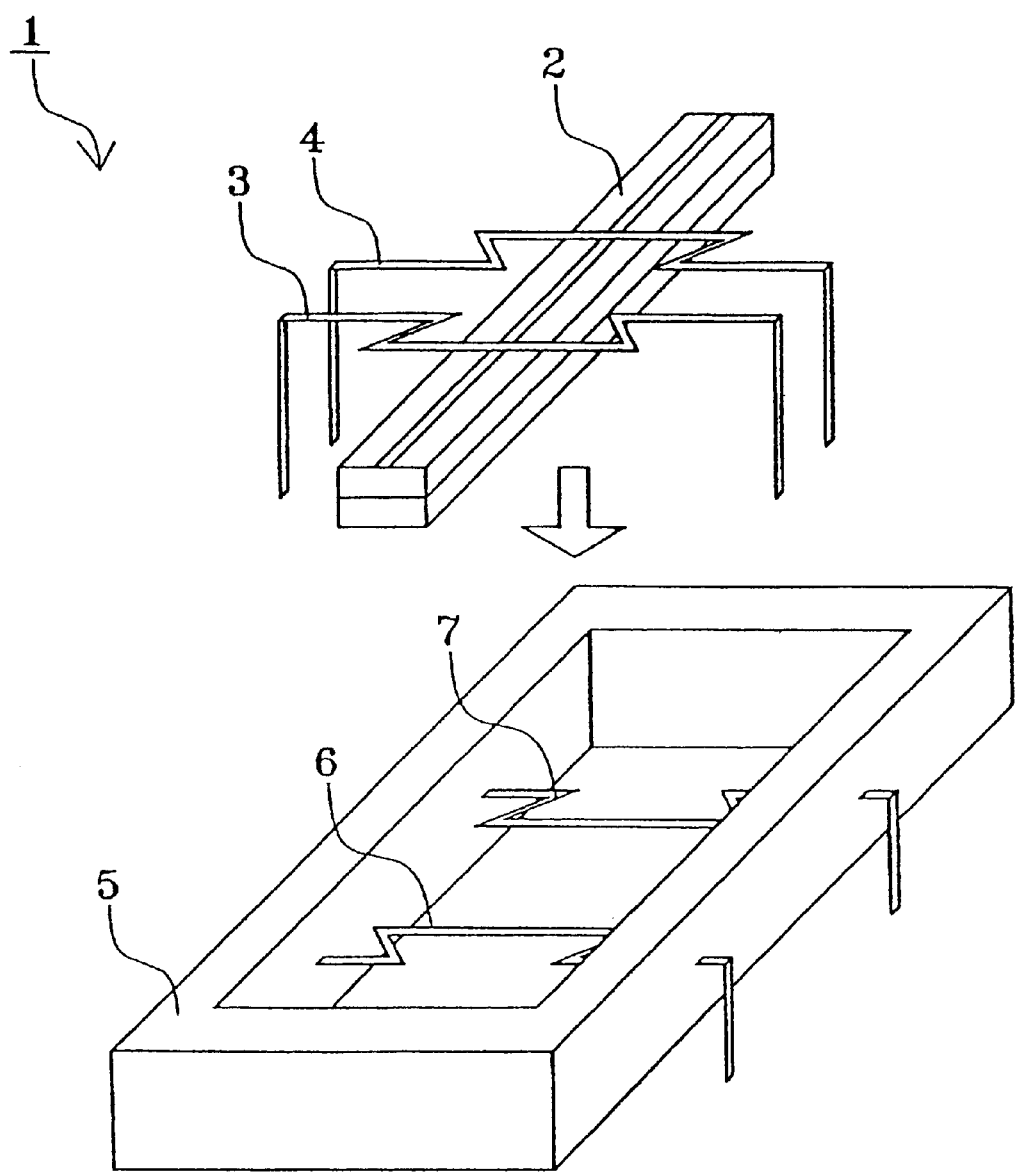
FIG. 2 is a perspective exploded view illustrating the vibrator portion shown in FIG. 1.

FIG. 1 is a perspective view showing a vibrator portion having a vibrator support structure according to preferred embodiments of the present invention, and FIG. 2 is a perspective exploded view illustrating the vibrator portion shown in FIG. 1. Referring to FIG. 2, the vibrator portion 1 includes a vibrator 2, support members 3, 4, 6, and 7, and a vibrator base 5. The support members 3 and 4 are adhered to one surface of the vibrator 2. On the other hand, the support members 6 and 7 are insert-molded into the vibrator base 5 having a frame shape. The vibrator 2 is positioned in the frame of this vibrator base 5, then the support members 6 and 7 are adhered to the other surface of the vibrator 2, and the support members 3 and 4 are adhered to one surface of the vibrator base 5. Thereby, as shown in FIG. 1, the vibrator portion 1 has a configuration wherein the vibrator 2 is clamped and supported in midair, by the support members 3, 4, 6, and 7 held and adhered to the vibrator base 5.

The vibrator base 5 is preferably constituted of a high specific-gravity resin material having a specific gravity of about 3.0 or greater. The vibrator base 5 is molded of a material obtained by mixing particles of a metal such as tungsten, stainless steel, or particles of a ceramic into a resin such as nylon, or other suitable material. The specific gravity can be optionally set up to about 15, depending on the kind of resin and the combination of mixed materials.

According to the vibrator support structure used in the vibrator portion 1, since a material having a specific gravity of about 3.0 or greater as a material for the vibrator base 5 is used, the weight of the vibrator base 5 can be made large. This allows the vibrator base to be miniaturized, and consequently, downsizing of the vibrating gyroscope to be achieved. In addition, since the vibrator support structure can be produced by injection molding with the metal or ceramic particles mixed therein as well as in the case where a metal or a ceramic is not mixed, the increase in the production cost thereof can be prevented.

As compared with conventional vibrator bases having the same size as the vibrator base according to preferred embodiments of the present invention, the vibrator base according to preferred embodiments of the present invention has a large weight, so that its vibration confinement effect is greatly improved, and the vibration of its vibrator is stabilized, thereby increasing its detection accuracy of angular velocity.

In general, attaching a weight to the vibrator base can hinder the stability of the vibrator since there occurs a movement of the center of gravity of the whole toward the weight. However, according to preferred embodiments of the present invention, by making the vibrator base itself heavy, it is possible to make the position of the center of gravity agree with the position of the vibrator, and to more stabilize the vibration of the vibrator, thereby more greatly improving the detection accuracy of angular velocity.

Figure 3:
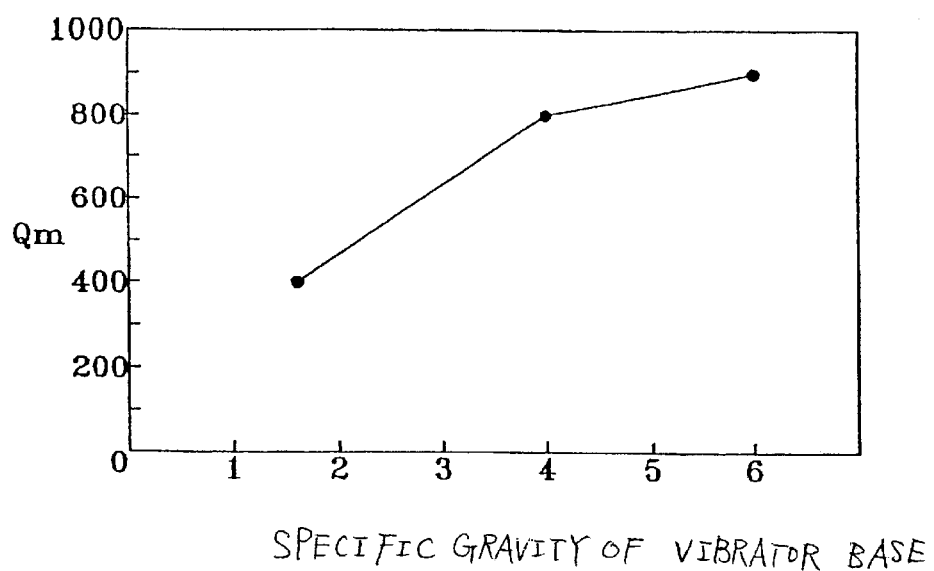
FIG. 3 is a characteristic view showing the relationship between the specific gravity of a vibrator base and the Q value of a vibrator.

FIG. 3 shows the relationship between the specific gravity of the vibrator base and the Q (Qm) value of the vibrator. As can be seen from the figure, as compared with the Qm value of 400 exhibited when using a liquid crystal polymer with a specific gravity of about 1.6, the Qm value when using a material with a specific gravity of about 4 increases to about 800, and further the Qm value when using a material with a specific gravity of about 6 rises to about 900.

Since a weight is not needed even when attempting to produce a high-accuracy vibrating gyroscope, the miniaturization thereof can be achieved, and also the number of assembly man-hours can be minimized by reducing the number of components.

Since the insulation of the vibrator base is maintained even though a metal or a ceramic is mixed into the material therefor, the insulation between the vibrator base and the support members insert-molded therein can be retained. Such mixing of a metal or a ceramic into the vibrator base material presents no problem even if the support members are used as wiring material.

Figure 4:
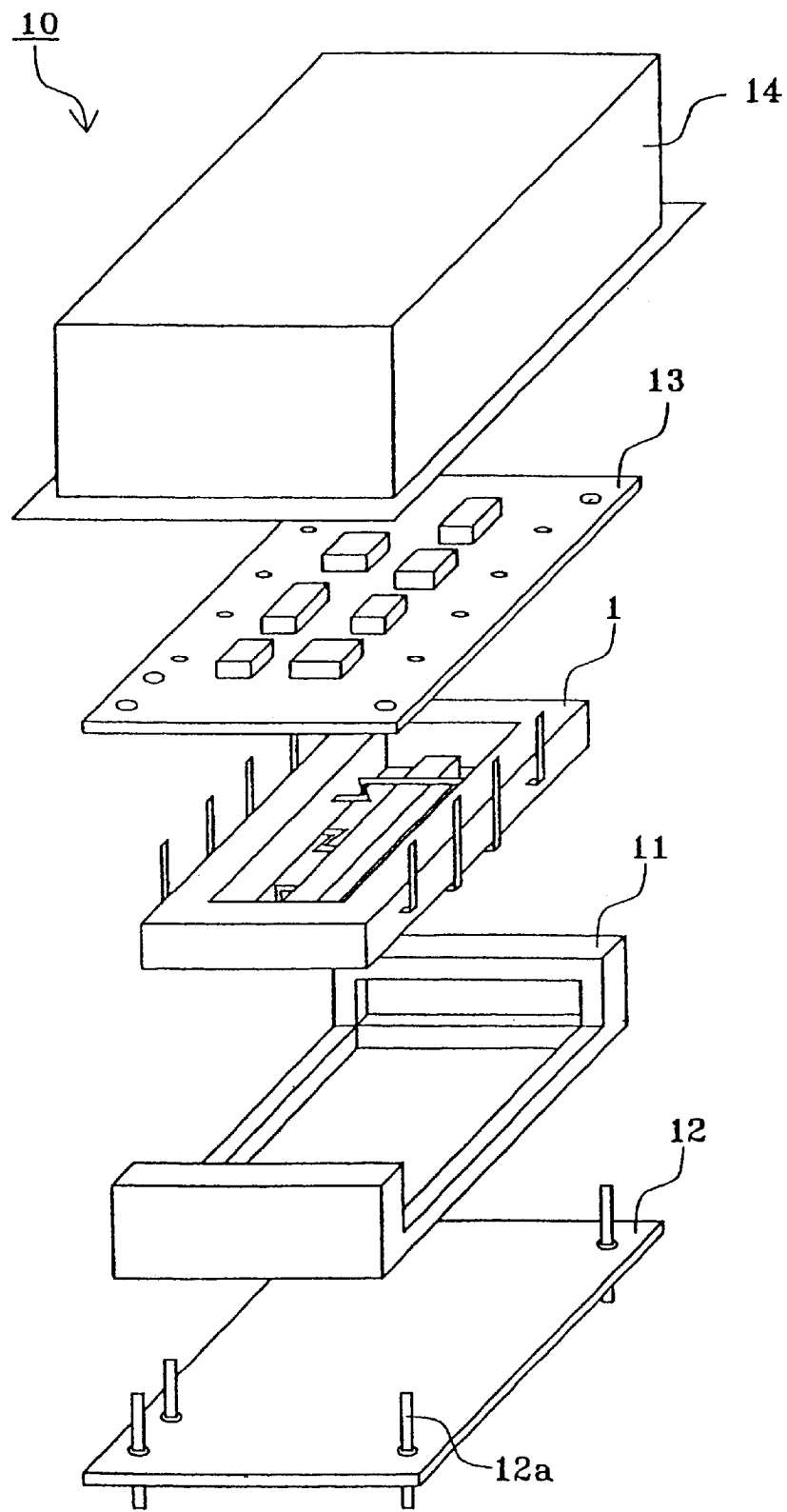
FIG. 4 is a perspective exploded view showing a preferred embodiment of a vibrating gyroscope according to the present invention.

FIG. 4 is a perspective exploded view showing a preferred embodiment of a vibrating gyroscope according to the present invention. Referring to FIG. 4, this vibrating gyroscope 10 includes the vibrator portion 1 having the vibrator support structure according to other preferred embodiments of the present invention shown in FIG. 1, a cushion 11 constituted of an elastic body molded of a silicon resin or EPDM, a metallic stem 12 on which terminals 12a are provided in advance in an insulated state, a circuit board 13 on which circuit components for driving the vibrator and detecting Coriolis signals outputted from the vibrator are mounted, and a metallic cover 14.

The vibrator portion 1 is accommodated in an accommodation portion provided in the cushion 11 so as to conform to the shape of the vibrator base, and is disposed on the stem 12. At this time, the vibrator portion 1 is disposed so that the end portion of each of the support members faces upward reversely to the state shown in FIG. 1.

The circuit board 13 is placed on the cushion 11 disposed on the stem 12. The circuit board 13 has through holes provided at the positions corresponding to the end portions of the support members of the vibrator portion 1, and at the positions corresponding to the terminals 12a of the stem 12, and the end portions of the support members and the terminals 12a are inserted into these through holes.

The end portions of the support members and the terminals 12a which have been inserted into the through holes are soldered to electrodes disposed on the circuit board 13, and thereby the vibrator portion 1 accommodated in the cushion 11 is sandwiched and secured by the circuit board 13 and the stem 12.

After the cover 14 has been placed on the stem 12, hermetic sealing is performed by resistance welding or another suitable method, and thereby the vibrating gyroscope 10 is constituted. Here, care must be taken to see that the cover 14 contacts only the stem 12 and that it does not contact the cushion 11 including the vibrator portion 1, nor the circuit board 13.

In the vibrating gyroscope having such a configuration, since a vibrator base with a large specific gravity is used for the vibrator portion 1, the miniaturization of the vibrator portion 1, and consequently, that of the vibrating gyroscope 10 can be achieved.

By accommodating the vibrator portion 1 in the cushion 11, vibrational impacts from the outside to the vibrator portion 1 can be reduced to a minimum, and the vibrator portion 1 can be prevented from transmitting outward slight vibration leaking therefrom.

Furthermore, by hermetically sealing the cover 14 and the stem 12, the airtightness inside can be maintained, and thereby, the deterioration of the vibrator and the circuit board 13 caused by moisture can be prevented. The cover 14 and the stem 12 also performs the function of an electromagnetic shield for preventing external electromagnetic waves from affecting operations of the vibrating gyroscope 10.

Figure 5:
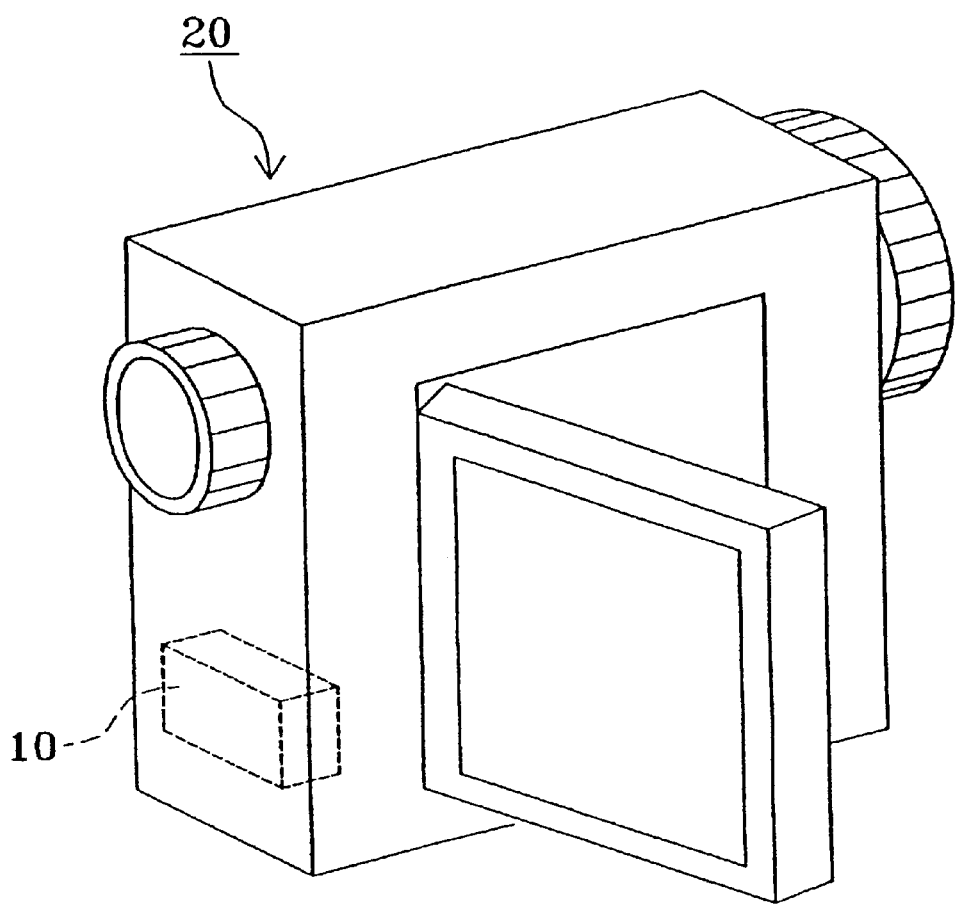
FIG. 5 is a perspective view showing an electronic device according to a preferred embodiment of the present invention.

FIG. 5 is a perspective view showing a video camera of another preferred embodiment of an electronic device according to the present invention. In FIG. 5, this video camera 20 has the vibrating gyroscope 10 according to other preferred embodiments of the present invention, for camera-vibration correction.

In the video camera 20 having such a configuration, since the vibration of the vibrator used for the vibrating gyroscope 10 is stable, the detection sensitivity to the angular velocity is also stable, and camera-vibration correction can be realized with a high degree of accuracy, leading to a high performance. In addition, by the miniaturization of the vibrating gyroscope 10, the miniaturization of the video camera 20 itself can also be achieved.

The electronic device according to this preferred embodiment of the present invention is not limited to a video camera, but it includes every electronic device using a vibrating gyroscope, such as a digital camera also using a vibrating gyroscope for camera-vibration correction, a navigation system used for position detection, a vehicle-attitude control system, or a vehicle rolling-over detection system, or other suitable devices.

As is evident from the foregoing, in the vibrator support structure of preferred embodiments of the present invention, by using a material having a specific gravity of about 3.0 or greater for the vibrator base which bears the support members supporting the vibrator, the stability of the vibration of the vibrator can be greatly improved with the weight of the vibrator base being increased while keeping the same shape. On the other hand, the miniaturization of the vibrator base can be achieved while keeping the same weight.

In the vibrating gyroscope according to preferred embodiments of the present invention, by having the above-described vibrator support structure, the vibration confinement effect is greatly improved, and the vibration is stabilized, resulting in an increased detection accuracy of angular velocity.

Also, in the electronic device according to preferred embodiments of the present invention, a high performance can be achieved.

While the present invention has been described with reference to what are at present considered to be preferred embodiments, it is to be understood that various changes and modifications may be made thereto without departing from the invention in its broader aspects and therefore, it is intended that the appended claims cover all such changes and modifications that fall within the true spirit and scope of the invention.

What is claimed is:

1. A vibrator support structure, comprising:
   a vibrator base;
   support members fixed to said vibrator base; and
   a vibrator supported by said support members;
   wherein said vibrator base is made of a material having a specific gravity of about 3.0 or greater.

2. A vibrator support structure according to claim 1, wherein said vibrator base comprises a molded body made of resin and at least one of metal and a ceramic.

3. A vibrator support structure according to claim 1, wherein the support members are adhered to at least one surface of the vibrator.

4. A vibrator support structure according to claim 1, wherein
   the vibrator is clamped and supported in midair by the support members.

5. A vibrator support structure according to claim 1, wherein said vibrator base comprises a molded body including particles of at least one of metal and a ceramic molded into a resin material.

6. A vibrator support structure according to claim 5, wherein the resin material has a specific gravity is about 15.

7. A vibrating gyroscope comprising the vibrator support structure according to claim 1.

8. A vibrating gyroscope according to claim 7, wherein said vibrator base comprises a molded body made of resin and at least one of metal and a ceramic.

9. A vibrating gyroscope according to claim 7, wherein the support members are adhered to at least one surface of the vibrator.

10. A vibrating gyroscope according to claim 7, wherein the vibrator is clamped and supported in midair by the support members.

11. A vibrating gyroscope according to claim 7, wherein said vibrator base comprises a molded body including particles of at least one of metal and a ceramic molded into a resin material.

12. A vibrating gyroscope according to claim 11, wherein the resin material has a specific gravity is about 15.

13. An electronic device comprising the vibrating gyroscope according to claim 7.

14. An electronic device according to claim 13, wherein the electronic device is a video camera.

* * * * *